US009026427B2

(12) United States Patent
Nguyen et al.

(10) Patent No.: US 9,026,427 B2
(45) Date of Patent: May 5, 2015

(54) METHOD AND APPARATUS FOR PRUNING SIDE INFORMATION INCLUDING DIRECTED EDGES NOT POSSESSING SHORTEST EXPANDED LENGTH FOR GRAMMAR-BASED COMPRESSION

(75) Inventors: Nguyen Nguyen, Waterloo (CA); En-hui Yang, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 1466 days.

(21) Appl. No.: 12/609,461

(22) Filed: Oct. 30, 2009

(65) Prior Publication Data
US 2011/0106526 A1 May 5, 2011

(51) Int. Cl.
- *G06F 17/27* (2006.01)
- *H03M 7/00* (2006.01)
- *G06F 17/30* (2006.01)
- *H03M 7/30* (2006.01)

(52) U.S. Cl.
CPC ............. *H03M 7/30* (2013.01); *G06F 17/2785* (2013.01); *G06F 17/30864* (2013.01)

(58) Field of Classification Search
CPC . G06F 17/2785; G06F 17/30864; H03M 7/30
USPC ................ 704/231, 9, 500; 341/60
See application file for complete search history.

(56) References Cited

U.S. PATENT DOCUMENTS

| | | | | |
|---|---|---|---|---|
| 6,492,917 | B1 * | 12/2002 | Goel et al. | 341/60 |
| 2007/0120712 | A1 | 5/2007 | Cai et al. | |
| 2008/0301323 | A1 * | 12/2008 | Yang et al. | 709/248 |
| 2010/0125594 | A1 * | 5/2010 | Li et al. | 707/758 |

OTHER PUBLICATIONS

Yang et al., "Efficient Universal Lossless Data Compression Algorithms Based on a Greedy Sequential Grammar Transform—Part Two: with Context Models", IEEE Transactions on Information Theory, Nov. 2003, XP002565239, pp. 2874-2894.
European Patent Application No. 091746719, Search Report dated Feb. 8, 2010.

(Continued)

*Primary Examiner* — Farzad Kazeminezhad
(74) *Attorney, Agent, or Firm* — Alexander Anishchenko; Borden Ladner Gervais LLP

(57) ABSTRACT

A computer-implemented method for generating side information for grammar-based data compression systems, such as YK compression systems, is described. An admissible grammar (G) for an input sequence $(A(S_0))$ having a finite set of terminal symbols is obtained. A graph representation of the admissible grammar (G) is then constructed. An edge having a lowest weight (expansion frequency), or one not possessing the shortest distance and or shortest expanded sequence length, is then pruned from the graph representation to generate a pruned graph representation. A pruned grammar (G') is then derived by removing the occurrence corresponding to the pruned edge from the grammar G and the starting variable $(S_{0,i})$ of the pruned grammar (Gi) is then expanded to generate the side information.

20 Claims, 8 Drawing Sheets

(56) References Cited

OTHER PUBLICATIONS

Kieffer et al., "Grammar-Based Codes: A New Class of Universal Lossless Source Codes", IEEE Transactions on Information Theory, May 2000, XP002565237. pp. 737-754.

Yang et al. "Efficient Universal Lossless Data Compression Algorithms Based on a Greedy Sequential Grammar Transform—Part One: Without Context Models", IEEE Transactions on Information Theory, vol. 46, No. 3, May 2000, pp. 755-788.

Kieffer, John C. et al., "Grammar-Based Codes: A New Class of Universal Lossless Source Codes", IEEE Transactions on Information Theory, vol. 46, No. 3, May 2000, pp. 737-754.

* cited by examiner

METHOD AND APPARATUS FOR PRUNING SIDE INFORMATION INCLUDING DIRECTED EDGES NOT POSSESSING SHORTEST EXPANDED LENGTH FOR GRAMMAR-BASED COMPRESSION

FIELD OF THE INVENTION

The present invention relates generally to data compression. More particularly, the present invention relates to a method of generating side information for use in grammar-based data compression systems.

BACKGROUND OF THE INVENTION

In the field of data communication, data is typically compressed so that the amount of information being transmitted is reduced. Such data compression enables faster transmission due to the decreased data traffic. By decreasing data traffic, compression also reduces power consumption, which is especially important in communication to portable or mobile communication devices with limited battery capacity. In conventional communication between a server and a mobile communication device, requested data, such as message data, a website, or a digital file, is encoded, or compressed, by the server, and then transmitted. A decoder at the mobile communication device decodes the compressed data, and processes it appropriately, such as displaying it to the user.

In grammar-based compression technologies, such as Yang-Kieffer (YK) universal data compression, grammars are created on-the-fly. However, knowledge of previously communicated data, or knowledge of related grammars, can significantly improve compression performance. Such knowledge, falling within the definition of "side information", which is any additional or related information that can be used to improve performance of coding or compression, can be used to augment encoders and decoders in the compression system. For example, in zlib, the sliding window can be primed with a predetermined dictionary of strings that are likely to occur in the data to be compressed (see e.g. J.-L. Gailly, "ZLIB compressed data format specification version 3.3," RFC 1950, May 1996). The choice of the side information influences the compression ratio achieved by the compression system.

The compression ratio improves when the side information provided to the compression system is strongly correlated with the data to be compressed. However, practical constraints, such as the time, space and bandwidth needed to process, store and transmit the side information respectively, impose an upper limit on the amount of side information that can be handled or provided to the compression system. This limit will often be much less than the amount of data that is actually available. It is, therefore, desirable to provide a method that extracts a relatively small, but still strongly correlated, side information data sequence from a large candidate pool.

BRIEF DESCRIPTION OF THE DRAWINGS

Embodiments of the present invention will now be described, by way of example only, with reference to the attached Figures, wherein.

DETAILED DESCRIPTION

Figure 1:
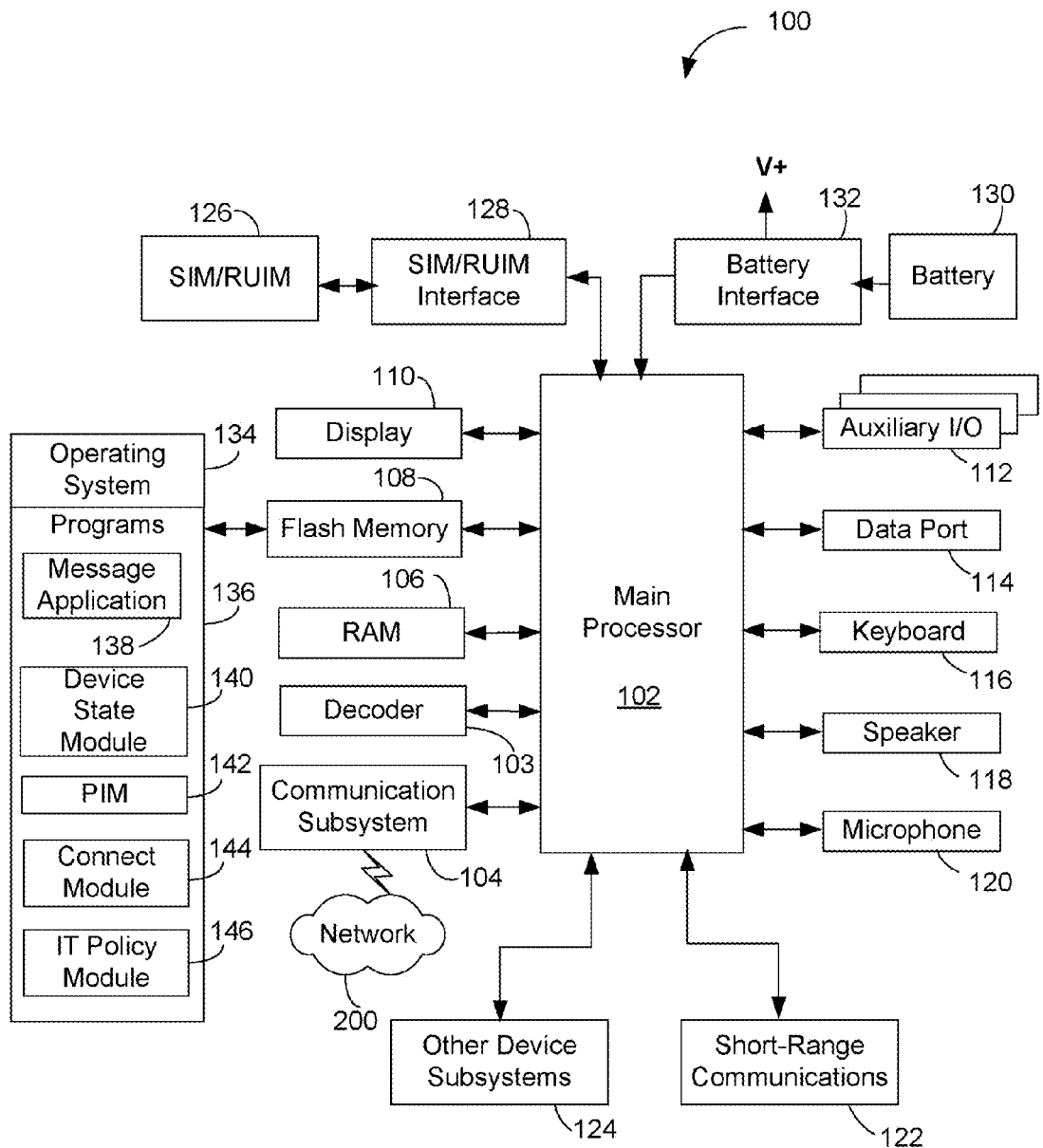
FIG. 1 is a block diagram of an exemplary embodiment of a portable electronic device.

A computer-implemented method for generating side information for grammar-based data compression systems is described in detail herein. The embodiments described herein generally relate to mobile wireless communication devices, hereafter referred to as a portable electronic devices. Examples of applicable communication devices include pagers, cellular phones, cellular smart-phones, wireless organizers, personal digital assistants, computers, laptops, handheld wireless communication devices, wirelessly enabled notebook computers and the like. It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. For example, specific details are not provided as to whether the embodiments of the invention described herein are implemented as a software routine, hardware circuit, firmware, or a combination thereof. Also, the description is not to be considered as limiting the scope of the embodiments described herein.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

A portable electronic device is a two-way communication device with advanced data communication capabilities including the capability to communicate with other portable electronic devices or computer systems through a network of transceiver stations. The portable electronic device may also have the capability to allow voice communication. Depending on the functionality provided by the portable electronic device, it may be referred to as a data messaging device, a two-way pager, a cellular telephone with data messaging capabilities, a wireless Internet appliance, or a data communication device (with or without telephony capabilities). To aid the reader in understanding the structure of the portable electronic device and how it communicates with other devices and host systems, reference will now be made to FIGS. 1 through 4.

Referring first to FIG. 1, shown therein is a block diagram of an exemplary embodiment of a portable electronic device 100. The portable electronic device 100 includes a number of components such as a main processor 102 that controls the overall operation of the portable electronic device 100. Communication functions, including data and voice communications, are performed through a communication subsystem 104. Data received by the portable electronic device 100 can be decompressed and decrypted by decoder 103, operating according to any suitable decompression techniques (e.g. YK decompression, and other known techniques) and encryption techniques (e.g. using encryption techniques such as Data Encryption Standard (DES), Triple DES, or Advanced Encryption Standard (AES)). The communication subsystem 104 receives messages from and sends messages to a wireless network 200. In this exemplary embodiment of the portable electronic device 100, the communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that the embodiments described herein are intended to use any other suitable standards that are developed in the future. The wireless link connecting the communication subsystem 104 with the wireless network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 200 associated with portable electronic device 100 is a GSM/GPRS wireless network in one exemplary implementation, other wireless networks may also be associated with the portable electronic device 100 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems. The main processor 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, short-range communications 122 and other device subsystems 124.

Some of the subsystems of the portable electronic device 100 perform communication-related functions, whereas other subsystems may provide "resident" or on-device functions. By way of example, the display 110 and the keyboard 116 may be used for both communication-related functions, such as entering a text message for transmission over the network 200, and device-resident functions such as a calculator or task list.

The portable electronic device 100 can send and receive communication signals over the wireless network 200 after required network registration or activation procedures have been completed. Network access is associated with a subscriber or user of the portable electronic device 100. To identify a subscriber, the portable electronic device 100 requires a SIM/RUIM card 126 (i.e. Subscriber Identity Module or a Removable User Identity Module) to be inserted into a SIM/RUIM interface 128 in order to communicate with a network. The SIM card or RUIM 126 is one type of a conventional "smart card" that can be used to identify a subscriber of the portable electronic device 100 and to personalize the portable electronic device 100, among other things. Without the SIM card 126, the portable electronic device 100 is not fully operational for communication with the wireless network 200. By inserting the SIM card/RUIM 126 into the SIM/RUIM interface 128, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. The SIM card/RUIM 126 includes a processor and memory for storing information. Once the SIM card/RUIM 126 is inserted into the SIM/RUIM interface 128, it is coupled to the main processor 102. In order to identify the subscriber, the SIM card/RUIM 126 can include some user parameters such as an International Mobile Subscriber Identity (IMSI). An advantage of using the SIM card/RUIM 126 is that a subscriber is not necessarily bound by any single physical portable electronic device. The SIM card/RUIM 126 may store additional subscriber information for a portable electronic device as well, including datebook (or calendar) information and recent call information. Alternatively, user identification information can also be programmed into the flash memory 108.

The portable electronic device 100 is a battery-powered device and includes a battery interface 132 for receiving one or more rechargeable batteries 130. In at least some embodiments, the battery 130 can be a smart battery with an embedded microprocessor. The battery interface 132 is coupled to a regulator (not shown), which assists the battery 130 in providing power V+ to the portable electronic device 100. Although current technology makes use of a battery, future technologies such as micro fuel cells may provide the power to the portable electronic device 100.

The portable electronic device 100 also includes an operating system 134 and software components 136 to 146 which are described in more detail below. The operating system 134 and the software components 136 to 146 that are executed by the main processor 102 are typically stored in a persistent store such as the flash memory 108, which may alternatively be a read-only memory (ROM) or similar storage element (not shown). Those skilled in the art will appreciate that portions of the operating system 134 and the software components 136 to 146, such as specific device applications, or parts thereof, may be temporarily loaded into a volatile store such as the RAM 106. Other software components can also be included, as is well known to those skilled in the art.

The subset of software applications 136 that control basic device operations, including data and voice communication applications, will normally be installed on the portable electronic device 100 during its manufacture. Other software applications include a message application 138 that can be any suitable software program that allows a user of the portable electronic device 100 to send and receive electronic messages. Various alternatives exist for the message application 138 as is well known to those skilled in the art. Messages that have been sent or received by the user are typically stored in the flash memory 108 of the portable electronic device 100 or some other suitable storage element in the portable electronic device 100. In at least some embodiments, some of the sent and received messages may be stored remotely from the device 100 such as in a data store of an associated host system that the portable electronic device 100 communicates with.

The software applications can further include a device state module 140, a Personal Information Manager (PIM) 142, and other suitable modules (not shown). The device state module 140 provides persistence, i.e. the device state module 140 ensures that important device data is stored in persistent memory, such as the flash memory 108, so that the data is not lost when the portable electronic device 100 is turned off or loses power.

The PIM 142 includes functionality for organizing and managing data items of interest to the user, such as, but not limited to, e-mail, contacts, calendar events, voice mails, appointments, and task items. A PIM application has the ability to send and receive data items via the wireless network 200. PIM data items may be seamlessly integrated, synchronized, and updated via the wireless network 200 with the portable electronic device subscriber's corresponding data items stored and/or associated with a host computer system. This functionality creates a mirrored host computer on the portable electronic device 100 with respect to such items. This can be particularly advantageous when the host computer system is the portable electronic device subscriber's office computer system.

The portable electronic device 100 also includes a connect module 144, and an information technology (IT) policy module 146. The connect module 144 implements the communication protocols that are required for the portable electronic device 100 to communicate with the wireless infrastructure and any host system, such as an enterprise system, that the portable electronic device 100 is authorized to interface with. Examples of a wireless infrastructure and an enterprise system are given in FIGS. 3 and 4, which are described in more detail below.

The connect module 144 includes a set of APIs that can be integrated with the portable electronic device 100 to allow the portable electronic device 100 to use any number of services associated with the enterprise system. The connect module 144 allows the portable electronic device 100 to establish an end-to-end secure, authenticated communication pipe with the host system. A subset of applications for which access is provided by the connect module 144 can be used to pass IT policy commands from the host system to the portable electronic device 100. This can be done in a wireless or wired manner. These instructions can then be passed to the IT policy module 146 to modify the configuration of the device 100. Alternatively, in some cases, the IT policy update can also be done over a wired connection.

Other types of software applications can also be installed on the portable electronic device 100. These software applications can be third party applications, which are added after the manufacture of the portable electronic device 100. Examples of third party applications include games, calculators, utilities, etc.

The additional applications can be loaded onto the portable electronic device 100 through at least one of the wireless network 200, the auxiliary I/O subsystem 112, the data port 114, the short-range communications subsystem 122, or any other suitable device subsystem 124. This flexibility in application installation increases the functionality of the portable electronic device 100 and may provide enhanced on-device functions, communication-related functions, or both. For example, secure communication applications may enable electronic commerce functions and other such financial transactions to be performed using the portable electronic device 100.

The data port 114 enables a subscriber to set preferences through an external device or software application and extends the capabilities of the portable electronic device 100 by providing for information or software downloads to the portable electronic device 100 other than through a wireless communication network. The alternate download path may, for example, be used to load an encryption key onto the portable electronic device 100 through a direct and thus reliable and trusted connection to provide secure device communication.

The data port 114 can be any suitable port that enables data communication between the portable electronic device 100 and another computing device. The data port 114 can be a serial or a parallel port. In some instances, the data port 114 can be a USB port that includes data lines for data transfer and a supply line that can provide a charging current to charge the battery 130 of the portable electronic device 100.

The short-range communications subsystem 122 provides for communication between the portable electronic device 100 and different systems or devices, without the use of the wireless network 200. For example, the subsystem 122 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download will be processed by the communication subsystem 104 and input to the main processor 102. The main processor 102, in conjunction with the decoder 103, will then process the received signal for output to the display 110 or alternatively to the auxiliary I/O subsystem 112. A subscriber may also compose data items, such as e-mail messages, for example, using the keyboard 116 in conjunction with the display 110 and possibly the auxiliary I/O subsystem 112. The auxiliary subsystem 112 may include devices such as: a touch screen, mouse, track ball, infrared fingerprint detector, or a roller wheel with dynamic button pressing capability. The keyboard 116 is preferably an alphanumeric keyboard and/or telephone-type keypad. However, other types of keyboards may also be used. A composed item may be transmitted over the wireless network 200 through the communication subsystem 104.

For voice communications, the overall operation of the portable electronic device 100 is substantially similar, except that the received signals are output to the speaker 118, and signals for transmission are generated by the microphone 120. Alternative voice or audio I/O subsystems, such as a voice message recording subsystem, can also be implemented on the portable electronic device 100. Although voice or audio signal output is accomplished primarily through the speaker 118, the display 110 can also be used to provide additional information such as the identity of a calling party, duration of a voice call, or other voice call related information.

Figure 2:
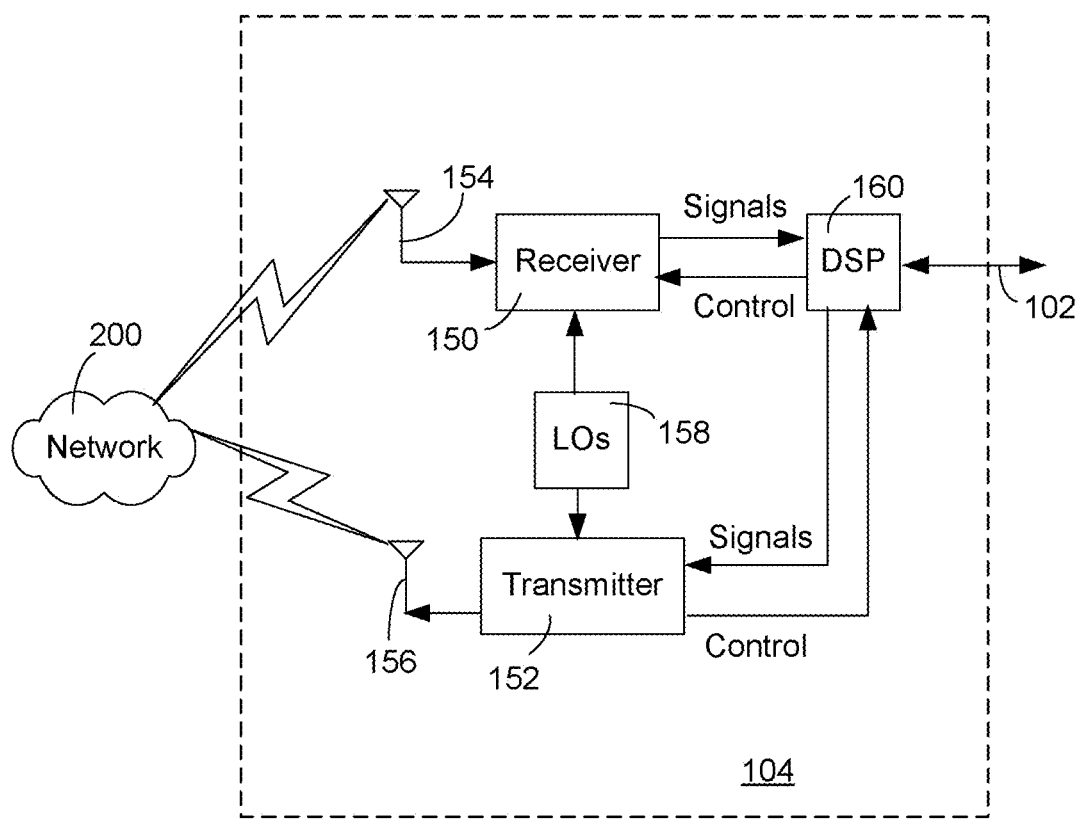
FIG. 2 is a block diagram of an exemplary embodiment of a communication subsystem component of the portable electronic device of FIG. 1.

Referring now to FIG. 2, an exemplary block diagram of the communication subsystem component 104 is shown. The communication subsystem 104 includes a receiver 150, a transmitter 152, as well as associated components such as one or more embedded or internal antenna elements 154 and 156, Local Oscillators (LOs) 158, and a processing module such as a Digital Signal Processor (DSP) 160. The particular design of the communication subsystem 104 is dependent upon the communication network 200 with which the portable electronic device 100 is intended to operate. Thus, it should be understood that the design illustrated in FIG. 2 serves only as one example.

Signals received by the antenna 154 through the wireless network 200 are input to the receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed in the DSP 160. In a similar manner, signals to be transmitted are processed, including modulation and encoding, by the DSP 160. These DSP-processed signals are input to the transmitter 152 for digital-to-analog (D/A) conversion, frequency up conversion, filtering, amplification and transmission over the wireless network 200 via the antenna 156. The DSP 160 not only processes communication signals, but also provides for receiver and transmitter control. For example, the gains applied to communication signals in the receiver 150 and the transmitter 152 may be adaptively controlled through automatic gain control algorithms implemented in the DSP 160.

The wireless link between the portable electronic device 100 and the wireless network 200 can contain one or more different channels, typically different RF channels, and associated protocols used between the portable electronic device 100 and the wireless network 200. An RF channel is a limited resource that should be conserved, typically due to limits in overall bandwidth and limited battery power of the portable electronic device 100.

When the portable electronic device 100 is fully operational, the transmitter 152 is typically keyed or turned on only when it is transmitting to the wireless network 200 and is otherwise turned off to conserve resources. Similarly, the receiver 150 is periodically turned off to conserve power until it is needed to receive signals or information (if at all) during designated time periods.

Figure 3:
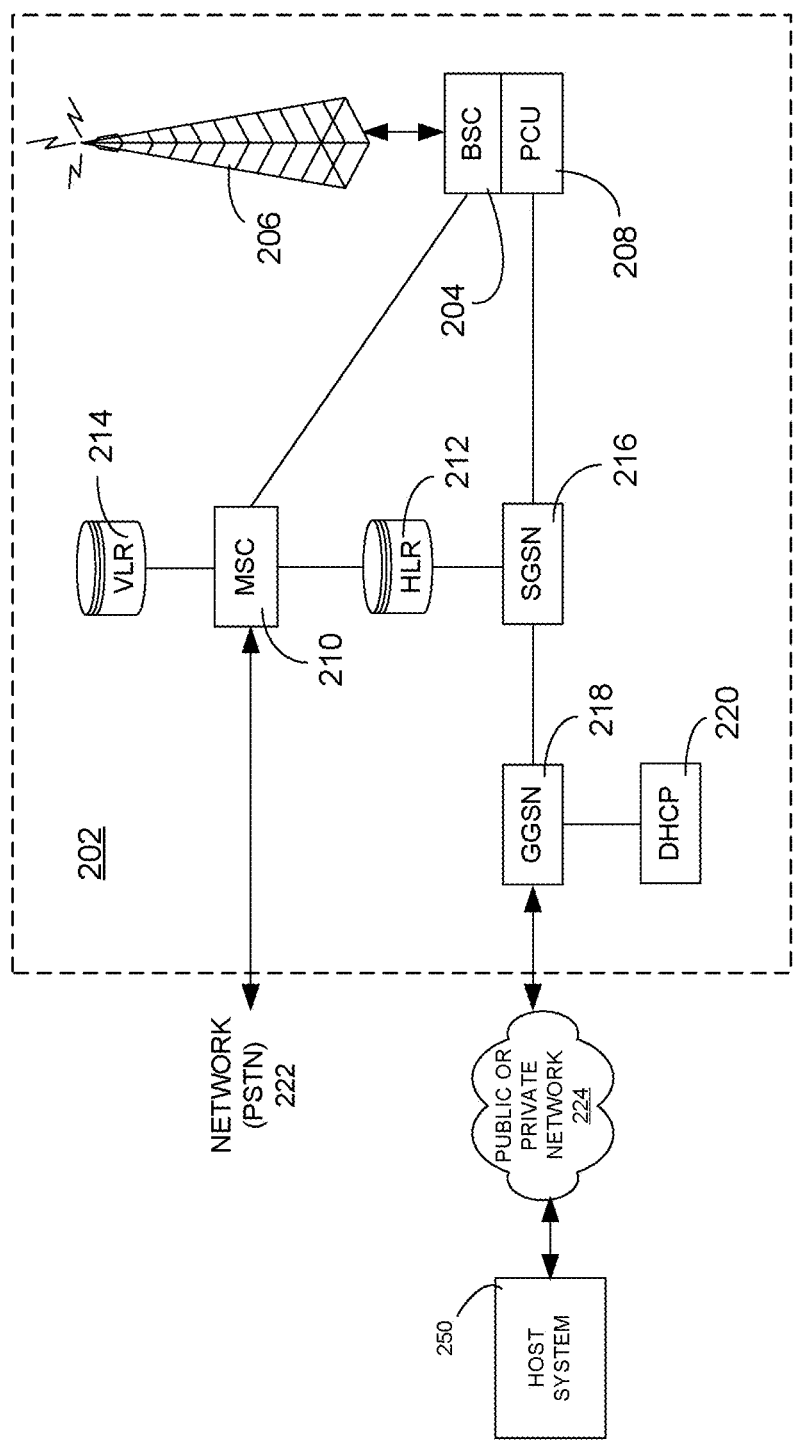
FIG. 3 is an exemplary block diagram of a node of a wireless network.

Referring now to FIG. 3, a block diagram of an exemplary implementation of a node 202 of the wireless network 200 is shown. In practice, the wireless network 200 comprises one or more nodes 202. In conjunction with the connect module 144, the portable electronic device 100 can communicate with the node 202 within the wireless network 200. In the exemplary implementation of FIG. 3, the node 202 is configured in accordance with General Packet Radio Service (GPRS) and Global Systems for Mobile (GSM) technologies. The node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through the network 200.

In a GSM network, the MSC 210 is coupled to the BSC 204 and to a landline network, such as a Public Switched Telephone Network (PSTN) 222 to satisfy circuit switched requirements. The connection through the PCU 208, the SGSN 216 and the GGSN 218 to a public or private network (Internet) 224 (also referred to herein generally as a shared network infrastructure) represents the data path for GPRS capable portable electronic devices. In a GSM network extended with GPRS capabilities, the BSC 204 also contains the Packet Control Unit (PCU) 208 that connects to the SGSN 216 to control segmentation, radio channel allocation and to satisfy packet switched requirements. To track the location of the portable electronic device 100 and availability for both circuit switched and packet switched management, the HLR 212 is shared between the MSC 210 and the SGSN 216. Access to the VLR 214 is controlled by the MSC 210.

The station 206 is a fixed transceiver station and together with the BSC 204 form fixed transceiver equipment. The fixed transceiver equipment provides wireless network coverage for a particular coverage area commonly referred to as a "cell". The fixed transceiver equipment transmits communication signals to and receives communication signals from portable electronic devices within its cell via the station 206. The fixed transceiver equipment normally performs such functions as modulation and possibly encoding and/or encryption of signals to be transmitted to the portable electronic device 100 in accordance with particular, usually predetermined, communication protocols and parameters, under control of its controller. The fixed transceiver equipment similarly demodulates and possibly decodes and decrypts, if necessary, any communication signals received from the portable electronic device 100 within its cell. Communication protocols and parameters may vary between different nodes. For example, one node may employ a different modulation scheme and operate at different frequencies than other nodes.

For all portable electronic devices 100 registered with a specific network, permanent configuration data such as a user profile is stored in the HLR 212. The HLR 212 also contains location information for each registered portable electronic device and can be queried to determine the current location of a portable electronic device. The MSC 210 is responsible for a group of location areas and stores the data of the portable electronic devices currently in its area of responsibility in the VLR 214. Further, the VLR 214 also contains information on portable electronic devices that are visiting other networks. The information in the VLR 214 includes part of the permanent portable electronic device data transmitted from the HLR 212 to the VLR 214 for faster access. By moving additional information from a remote HLR 212 node to the VLR 214, the amount of traffic between these nodes can be reduced so that voice and data services can be provided with faster response times and at the same time requiring less use of computing resources.

The SGSN 216 and the GGSN 218 are elements added for GPRS support; namely packet switched data support, within GSM. The SGSN 216 and the MSC 210 have similar responsibilities within the wireless network 200 by keeping track of the location of each portable electronic device 100. The SGSN 216 also performs security functions and access control for data traffic on the wireless network 200. The GGSN 218 provides internetworking connections with external packet switched networks and connects to one or more SGSN's 216 via an Internet Protocol (IP) backbone network operated within the network 200. During normal operations, a given portable electronic device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring the DHCP server 220 connected to the GGSN 218. There are many mechanisms for dynamic IP assignment, including using a combination of a Remote Authentication Dial-In User Service (RADIUS) server and a DHCP server. Once the GPRS Attach is complete, a logical connection is established from a portable electronic device 100, through the PCU 208, and the SGSN 216 to an Access Point Node (APN) within the GGSN 218. The APN represents a logical end of an IP tunnel that can either access direct Internet compatible services or private network connections. The APN also represents a security mechanism for the network 200, insofar as each portable electronic device 100 must be assigned to one or more APNs and portable electronic devices 100 cannot exchange data without first performing a GPRS Attach to an APN that it has been authorized to use. The APN may be considered to be similar to an Internet domain name such as "myconnection.wireless.com".

Once the GPRS Attach operation is complete, a tunnel is created and all traffic is exchanged within standard IP packets using any protocol that can be supported in IP packets. This includes tunneling methods such as IP over IP as in the case with some IPSecurity (IPsec) connections used with Virtual Private Networks (VPN). These tunnels are also referred to as Packet Data Protocol (PDP) Contexts and there are a limited number of these available in the network 200. To maximize use of the PDP Contexts, the network 200 will run an idle timer for each PDP Context to determine if there is a lack of activity. When a portable electronic device 100 is not using its PDP Context, the PDP Context can be de-allocated and the IP address returned to the IP address pool managed by the DHCP server 220.

Figure 4:
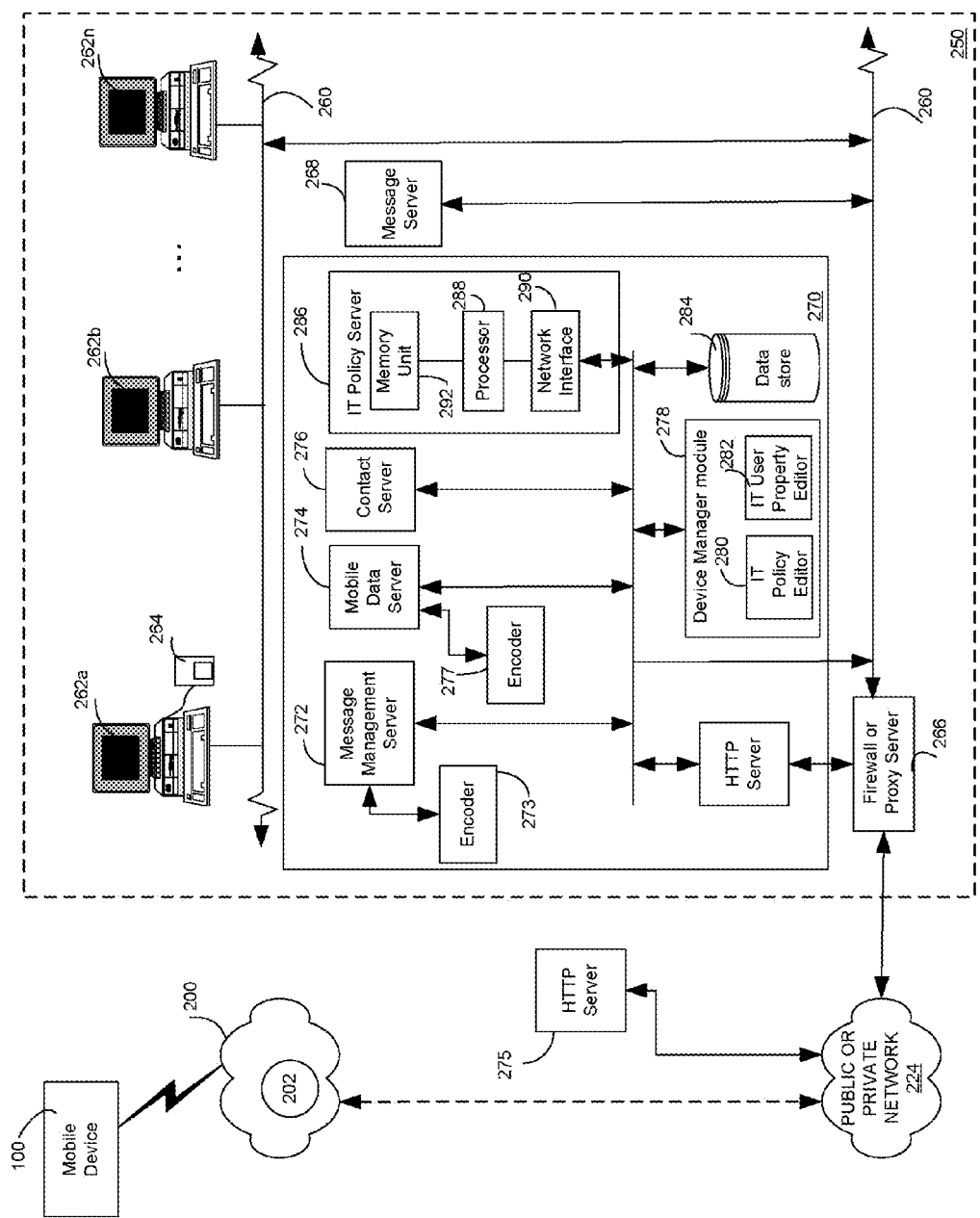
FIG. 4 is a block diagram illustrating components of a host system in one exemplary configuration for use with the wireless network of FIG. 3 and the portable electronic device of FIG. 1.

Referring now to FIG. 4, shown therein is a block diagram illustrating components of an exemplary configuration of a host system 250 that the portable electronic device 100 can communicate with in conjunction with the connect module 144. The host system 250 will typically be a corporate enterprise or other local area network (LAN), but may also be a home office computer or some other private system, for example, in variant implementations. In this example shown in FIG. 4, the host system 250 is depicted as a LAN of an organization to which a user of the portable electronic device 100 belongs. Typically, a plurality of portable electronic devices can communicate wirelessly with the host system 250 through one or more nodes 202 of the wireless network 200.

The host system 250 comprises a number of network components connected to each other by a network 260. For instance, a user's desktop computer 262a with an accompanying cradle 264 for the user's portable electronic device 100 is situated on a LAN connection. The cradle 264 for the portable electronic device 100 can be coupled to the computer 262a by a serial or a Universal Serial Bus (USB) connection, for example. Other user computers 262b-262n are also situated on the network 260, and each may or may not be equipped with an accompanying cradle 264. The cradle 264 facilitates the loading of information (e.g. PIM data, private symmetric encryption keys to facilitate secure communications) from the user computer 262a to the portable electronic device 100, and may be particularly useful for bulk information updates often performed in initializing the portable electronic device 100 for use. The information downloaded to the portable electronic device 100 may include certificates used in the exchange of messages.

It will be understood by persons skilled in the art that the user computers 262a-262n will typically also be connected to other peripheral devices, such as printers, etc. which are not explicitly shown in FIG. 4. Furthermore, only a subset of network components of the host system 250 are shown in FIG. 4 for ease of exposition, and it will be understood by persons skilled in the art that the host system 250 will comprise additional components that are not explicitly shown in FIG. 4 for this exemplary configuration. More generally, the host system 250 may represent a smaller part of a larger network (not shown) of the organization, and may comprise different components and/or be arranged in different topologies than that shown in the exemplary embodiment of FIG. 4.

To facilitate the operation of the portable electronic device 100 and the wireless communication of messages and message-related data between the portable electronic device 100 and components of the host system 250, a number of wireless communication support components 270 can be provided. In some implementations, the wireless communication support components 270 can include a message management server 272, a mobile data server (MDS) 274, a web server, such as Hypertext Transfer Protocol (HTTP) server 275, a contact server 276, and a device manager module 278. HTTP servers can also be located outside the enterprise system, as indicated by the HTTP server 275 attached to the network 224. The device manager module 278 includes an IT Policy editor 280 and an IT user property editor 282, as well as other software components for allowing an IT administrator to configure the portable electronic devices 100. In an alternative embodiment, there may be one editor that provides the functionality of both the IT policy editor 280 and the IT user property editor 282. The support components 270 also include a data store 284, and an IT policy server 286. The IT policy server 286 includes a processor 288, a network interface 290 and a memory unit 292. The processor 288 controls the operation of the IT policy server 286 and executes functions related to the standardized IT policy as described below. The network interface 290 allows the IT policy server 286 to communicate with the various components of the host system 250 and the portable electronic devices 100. The memory unit 292 can store functions used in implementing the IT policy as well as related data. Those skilled in the art know how to implement these various components. Other components may also be included as is well known to those skilled in the art. Further, in some implementations, the data store 284 can be part of any one of the servers.

In this exemplary embodiment, the portable electronic device 100 communicates with the host system 250 through node 202 of the wireless network 200 and a shared network infrastructure 224 such as a service provider network or the public Internet. Access to the host system 250 may be provided through one or more routers (not shown), and computing devices of the host system 250 may operate from behind a firewall or proxy server 266. The proxy server 266 provides a secure node and a wireless internet gateway for the host system 250. The proxy server 266 intelligently routes data to the correct destination server within the host system 250.

In some implementations, the host system 250 can include a wireless VPN router (not shown) to facilitate data exchange between the host system 250 and the portable electronic device 100. The wireless VPN router allows a VPN connection to be established directly through a specific wireless network to the portable electronic device 100. The wireless VPN router can be used with the Internet Protocol (IP) Version 6 (IPV6) and IP-based wireless networks. This protocol can provide enough IP addresses so that each portable electronic device has a dedicated IP address, making it possible to push information to a portable electronic device at any time. An advantage of using a wireless VPN router is that it can be an off-the-shelf VPN component, and does not require a separate wireless gateway and separate wireless infrastructure. A VPN connection can preferably be a Transmission Control Protocol (TCP)/IP or User Datagram Protocol (UDP)/IP connection for delivering the messages directly to the portable electronic device 100 in this alternative implementation.

Messages intended for a user of the portable electronic device 100 are initially received by a message server 268 of the host system 250. Such messages may originate from any number of sources. For instance, a message may have been sent by a sender from the computer 262b within the host system 250, from a different portable electronic device (not shown) connected to the wireless network 200 or a different wireless network, or from a different computing device, or other device capable of sending messages, via the shared network infrastructure 224, possibly through an application service provider (ASP) or Internet service provider (ISP), for example.

The message server 268 typically acts as the primary interface for the exchange of messages, particularly e-mail messages, within the organization and over the shared network infrastructure 224. Each user in the organization that has been set up to send and receive messages is typically associated with a user account managed by the message server 268. Some exemplary implementations of the message server 268 include a Microsoft Exchange™ server, a Lotus Domino™ server, a Novell Groupwise™ server, or another suitable mail server installed in a corporate environment. In some implementations, the host system 250 may comprise multiple message servers 268. The message server 268 may also be adapted to provide additional functions beyond message management, including the management of data associated with calendars and task lists, for example.

When messages are received by the message server 268, they are typically stored in a data store associated with the message server 268. In at least some embodiments, the data store may be a separate hardware unit, such as data store 284, that the message server 268 communicates with. Messages can be subsequently retrieved and delivered to users by accessing the message server 268. For instance, an e-mail client application operating on a user's computer 262a may request the e-mail messages associated with that user's account stored on the data store associated with the message server 268. These messages are then retrieved from the data store and stored locally on the computer 262a. The data store associated with the message server 268 can store copies of each message that is locally stored on the portable electronic device 100. Alternatively, the data store associated with the message server 268 can store all of the messages for the user of the portable electronic device 100 and only a smaller number of messages can be stored on the portable electronic device 100 to conserve memory. For instance, the most recent messages (i.e. those received in the past two to three months for example) can be stored on the portable electronic device 100.

When operating the portable electronic device 100, the user may wish to have e-mail messages retrieved for delivery to the portable electronic device 100. The message application 138 operating on the portable electronic device 100 may also request messages associated with the user's account from the message server 268. The message application 138 may be configured (either by the user or by an administrator, possibly in accordance with an organization's IT policy) to make this request at the direction of the user, at some pre-defined time interval, or upon the occurrence of some pre-defined event. In some implementations, the portable electronic device 100 is assigned its own e-mail address, and messages addressed specifically to the portable electronic device 100 are automatically redirected to the portable electronic device 100 as they are received by the message server 268.

The message management server 272 can be used to specifically provide support for the management of messages, such as e-mail messages, that are to be handled by portable electronic devices. Generally, while messages are still stored on the message server 268, the message management server 272 can be used to control when, if, and how messages are sent to the portable electronic device 100. The message management server 272 also facilitates the handling of messages composed on the portable electronic device 100, which are sent to the message server 268 for subsequent delivery.

For example, the message management server 272 may monitor the user's "mailbox" (e.g. the message store associated with the user's account on the message server 268) for new e-mail messages, and apply user-definable filters to new messages to determine if and how the messages are relayed to the user's portable electronic device 100. The message management server 272 may also, through an encoder 273, compress messages, using any suitable compression technology (e.g. YK compression, and other known techniques) and encrypt messages (e.g. using an encryption technique such as Data Encryption Standard (DES), Triple DES, or Advanced Encryption Standard (AES)), and push them to the portable electronic device 100 via the shared network infrastructure 224 and the wireless network 200. The message management server 272 may also receive messages composed on the portable electronic device 100 (e.g. encrypted using Triple DES), decrypt and decompress the composed messages, re-format the composed messages if desired so that they will appear to have originated from the user's computer 262a, and re-route the composed messages to the message server 268 for delivery.

Certain properties or restrictions associated with messages that are to be sent from and/or received by the portable electronic device 100 can be defined (e.g. by an administrator in accordance with IT policy) and enforced by the message management server 272. These may include whether the portable electronic device 100 may receive encrypted and/or signed messages, minimum encryption key sizes, whether outgoing messages must be encrypted and/or signed, and whether copies of all secure messages sent from the portable electronic device 100 are to be sent to a pre-defined copy address, for example.

The message management server 272 may also be adapted to provide other control functions, such as only pushing certain message information or pre-defined portions (e.g. "blocks") of a message stored on the message server 268 to the portable electronic device 100. For example, in some cases, when a message is initially retrieved by the portable electronic device 100 from the message server 268, the message management server 272 may push only the first part of a message to the portable electronic device 100, with the part being of a pre-defined size (e.g. 2 KB). The user can then request that more of the message be delivered in similar-sized blocks by the message management server 272 to the portable electronic device 100, possibly up to a maximum pre-defined message size. Accordingly, the message management server 272 facilitates better control over the type of data and the amount of data that is communicated to the portable electronic device 100, and can help to minimize potential waste of bandwidth or other resources.

The MDS 274 encompasses any other server that stores information that is relevant to the corporation. The mobile data server 274 may include, but is not limited to, databases, online data document repositories, customer relationship management (CRM) systems, or enterprise resource planning (ERP) applications. The MDS 274 can also connect to the Internet or other public network, through HTTP server 275 or other suitable web server such as an File Transfer Protocol (FTP) server, to retrieve HTTP webpages and other data. Requests for webpages are typically routed through MDS 274 and then to HTTP server 275, through suitable firewalls and other protective mechanisms. The web server then retrieves the webpage over the Internet, and returns it to MDS 274. As described above in relation to message management server 272, MDS 274 is typically provided, or associated, with an encoder 277 that permits retrieved data, such as retrieved webpages, to be compressed, using any suitable compression technology (e.g. YK compression, and other known techniques), and encrypted (e.g. using an encryption technique such as DES, Triple DES, or AES), and then pushed to the portable electronic device 100 via the shared network infrastructure 224 and the wireless network 200.

The contact server 276 can provide information for a list of contacts for the user in a similar fashion as the address book on the portable electronic device 100. Accordingly, for a given contact, the contact server 276 can include the name, phone number, work address and e-mail address of the contact, among other information. The contact server 276 can also provide a global address list that contains the contact information for all of the contacts associated with the host system 250.

It will be understood by persons skilled in the art that the message management server 272, the MDS 274, the HTTP server 275, the contact server 276, the device manager module 278, the data store 284 and the IT policy server 286 do not need to be implemented on separate physical servers within the host system 250. For example, some or all of the functions associated with the message management server 272 may be integrated with the message server 268, or some other server in the host system 250. Alternatively, the host system 250 may comprise multiple message management servers 272, particularly in variant implementations where a large number of portable electronic devices need to be supported.

The device manager module 278 provides an IT administrator with a graphical user interface with which the IT administrator interacts to configure various settings for the portable electronic devices 100. As mentioned, the IT administrator can use IT policy rules to define behaviors of certain applications on the portable electronic device 100 that are permitted such as phone, web browser or Instant Messenger use. The IT policy rules can also be used to set specific values for configuration settings that an organization requires on the portable electronic devices 100 such as auto signature text, WLAN/VoIP/VPN configuration, security requirements (e.g. encryption algorithms, password rules, etc.), specifying themes or applications that are allowed to run on the portable electronic device 100, and the like.

With reference to the previously described FIGS. 1-4, the present method for generating side information for grammar-based data compression systems will now be described. Grammar-based codes are based on constructing a context-free grammar for the string to be compressed (see e.g. Kieffer, John C. et al., "Grammar-Based Codes: A New Class of Universal Lossless Source Codes", IEEE Transactions on Information Theory, vol. 46, No. 3, May 2000, pp. 737-754). Examples of data compression algorithms that employ this approach include the Yang-Kieffer (YK) universal lossless data compression algorithm (referred to herein as "YK compression") and the Neville-Manning algorithm (also known as "SEQUITUR"), among others. To compress a data sequence $X=x_0 \ldots x_n$, a grammar-based code first transforms X into a context-free grammar G, and then uses an arithmetic coding algorithm to compress the grammar G. The non-limiting embodiments described herein use YK compression and a YK grammar to illustrate the method. A YK grammar inherently captures both the structure and statistics of a given information sequence. A thorough description of YK compression can be found in E.- h. Yang and J. C. Kieffer, "Efficient universal lossless data compression algorithms based on a greedy sequential grammar transform—Part one: Without context models," *IEEE Trans. Inform. Theory*, vol. 46, pp. 755-788, May 2000, the contents of which are incorporated herein by reference.

As will be apparent to those of skill in the art, the present method can be used to generate side information data for any compression method that can use such data to improve its performance. For example, it can be used to generate a preset dictionary for zlib.

The encoders at the server side host system 250, such as encoders 273 and 277, and the decoder 103 in the portable electronic device 100 form a data compression system. Related information, such as data sequences and grammars from previous communications between the host system 250 and the portable electronic device 100, can be stored in the data store 284, or other data store accessible to the host system. The present method can be implemented in any processor associated with the host system 250, such as processors within message management server 272 and MDS 274.

Generally, the present method provides a computer-implemented method for generating side information for grammar-based data compression systems. Given an information sequence $A(s_0)$ of length n, the goal of the method is to determine from $A(s_0)$ an information sequence $A(s_{0,i})$ of given length m<n that retains as much of the structural and statistical information contained in $A(s_0)$ as possible. In other words, the problem is to derive from $A(s_0)$ an information sequence that preserves its most relevant structure and statistics.

Figure 5A:
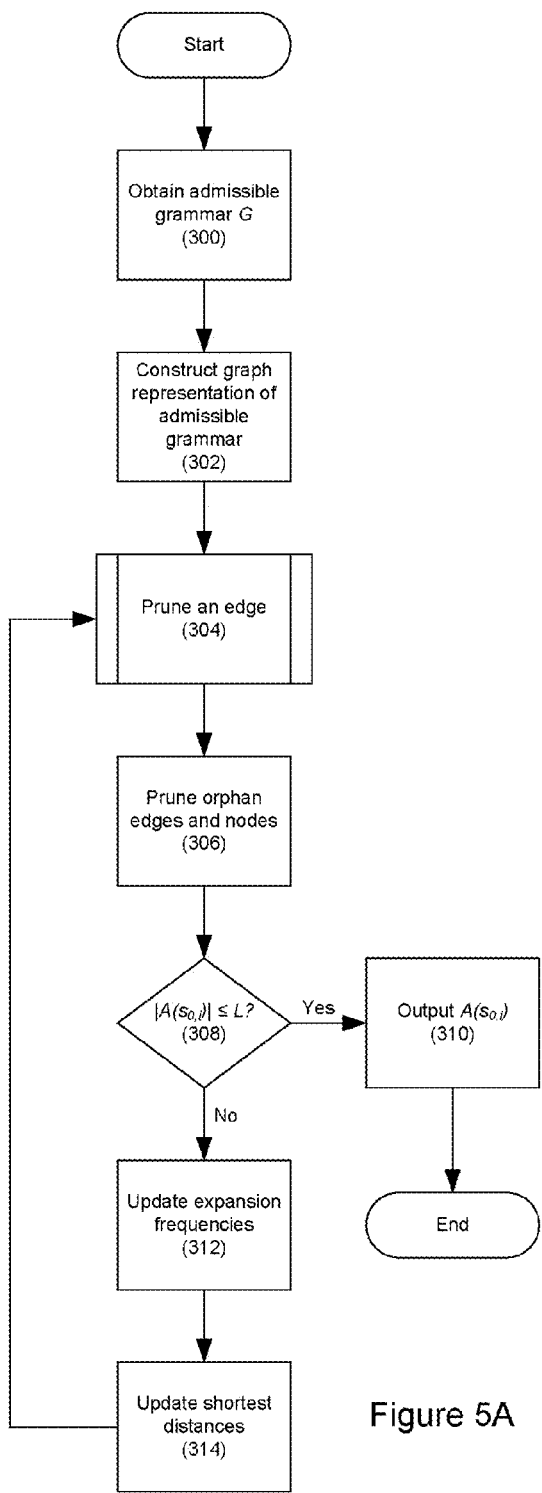
FIGS. 5A and 5B are flowcharts of a method according to an embodiment of the present invention.
Figure 5B:
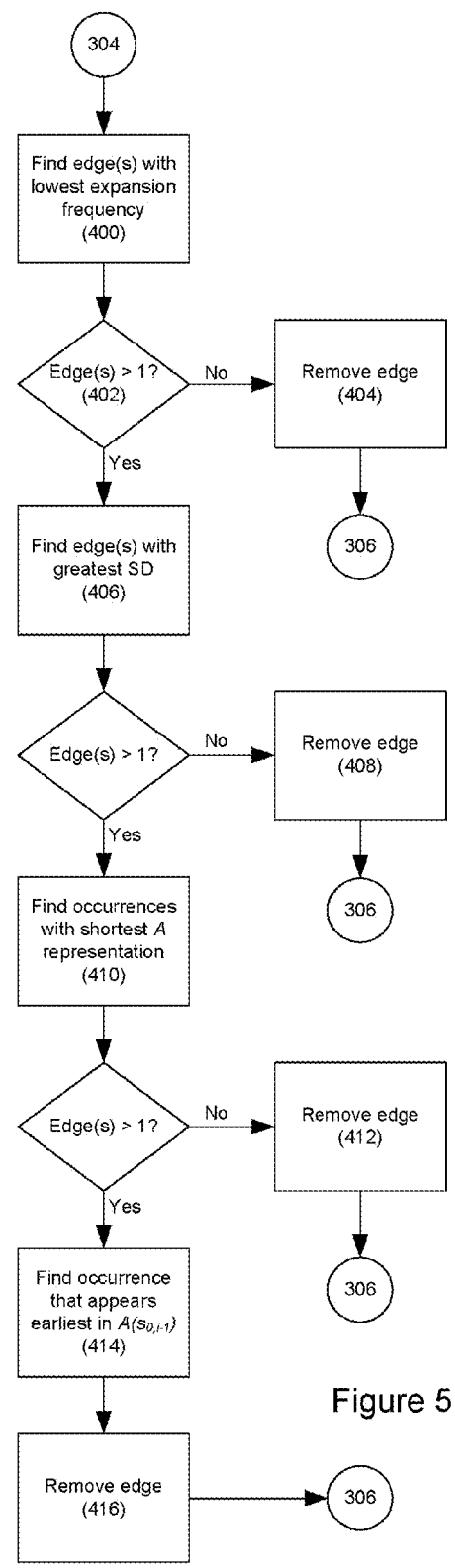

With reference to the flowcharts of FIGS. 5A and 5B, the method begins with obtaining an admissible grammar G for an input sequence $A(s_0)$ having a finite set of terminal symbols (step 300). An admissible grammar is a grammar that terminates after finitely many steps and every G-variable $s_i(i<j)$ is replaced at least once by $G(s_i)$ in the overall parallel replacement process, where $G(s_i)$ is the production rule for $s_i(i<j)$ as defined by G. According to described embodiments, the admissible grammar G is an irreducible grammar, such as a Yang-Kieffer grammar obtained by applying a YK grammar transformation to the input sequence. An irreducible grammar is a grammar that satisfies the following properties:

Each G-variable s other than $s_0$ appears at least twice in the range of G.

There is no non-overlapping repeated pattern of length greater than or equal to '2' in the range of G.

Each distinct G-variable represents a distinct A-sequence.

The following notation is used:

A denotes the "alphabet", which consists of terminal symbols

S(j) denotes the finite set of G-variables (grammar variables)

A(α) denotes the A-sequence of α∈S(j)

|x| denotes the length of a sequence x, or the cardinality of a set x

An example grammar G is given by the following production rules:

$s_0 \rightarrow s_2 s_5 s_4 s_5 s_6$
$s_1 \rightarrow dd$
$s_2 \rightarrow abbs_1$
$s_3 \rightarrow cs_1 c$
$s_4 \rightarrow s_2 s_3 b$
$s_5 \rightarrow s_6 s_3 s_4$
$s_6 \rightarrow aa$ where A={a, b, c, d}; a, b, c, d being the terminal symbols in the input data sequence, and S(j)={$s_0, s_1, s_2, s_3, s_4, s_5, s_6$}. Thus, the admissible grammar G has a finite set of variables S(j), including a starting variable $s_0$ representing the input sequence A($s_0$), and a production rule for each variable. This example grammar will be used throughout the rest of the description to illustrate the method.

Figure 6:
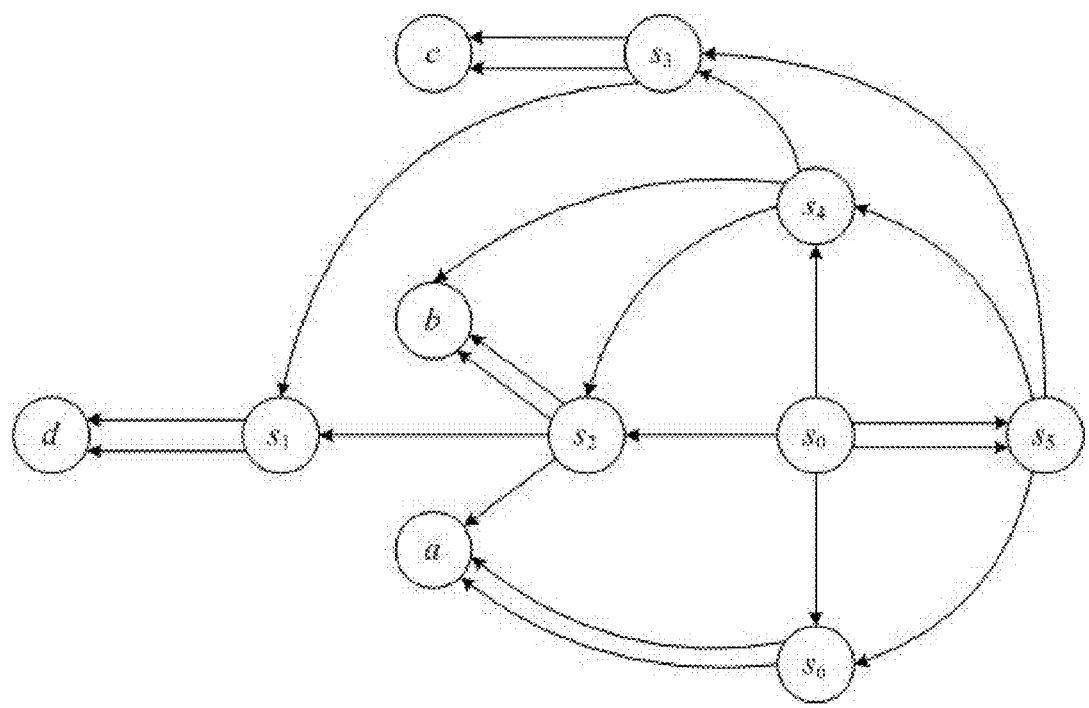
FIG. 6 is a graph representation of an example grammar G.

A graph representation of the admissible grammar G is then constructed (step 302) by completely expanding all its variables according to the production rules. The graph representation includes nodes for each variable and each terminal symbol, including a root node representing the starting variable ($s_0$), and directed edges linking the nodes. To construct the graph representation, first a node is drawn for every variable and terminal symbol. Then, beginning with i=0, the production rule for $s_i$ is expanded. That is, for each occurrence in the right member of the production rule for $s_i$, a directed edge is drawn from $s_i$ to the node representing the variable or terminal symbol specified for the occurrence. These steps are then repeated for i=1, 2, . . . , |S(j)|−1. For the example grammar G given above, constructing a graph representation results in the graph representation of FIG. 6.

The graph representation of a grammar has several properties:

It is acyclic.
There is exactly one node for each element in (S(j)∪A).
Nodes corresponding to elements in A (terminal symbols) are sinks (i.e. they have no outgoing edges).
The node corresponding to $s_0$ is the root node (i.e. it has no incoming edges).
The graph representation of a given grammar is unique.

The graph representation is important for several reasons. First, it allows the grammar and proposed algorithm to be described visually. Second, it can be implemented efficiently in practice in software.

Each edge, shown by the arrows, represents an occurrence, which is an instance of a variable or a terminal symbol in the admissible grammar G as defined by the production rules. The following notation: $(\alpha|\beta)_k$ denotes the occurrence of α∈(S(j)∪A) at position k in the right member of the production rule of β∈S(j). For example, the directed edge connecting nodes $s_0$ and $s_2$ represents the occurrence of $s_2$ in $s_0$: $(s_2|s_0)_0$; $(s_1|s_3)_1$ denotes the occurrence of $s_1$ at position 1 in the right member of the production rule of $s_3$; and $(s_3|s_4)_0$ does not exist (i.e. $s_3$ does not occur at position 0 in the right-hand side of production rule $s_4$).

Figure 7:
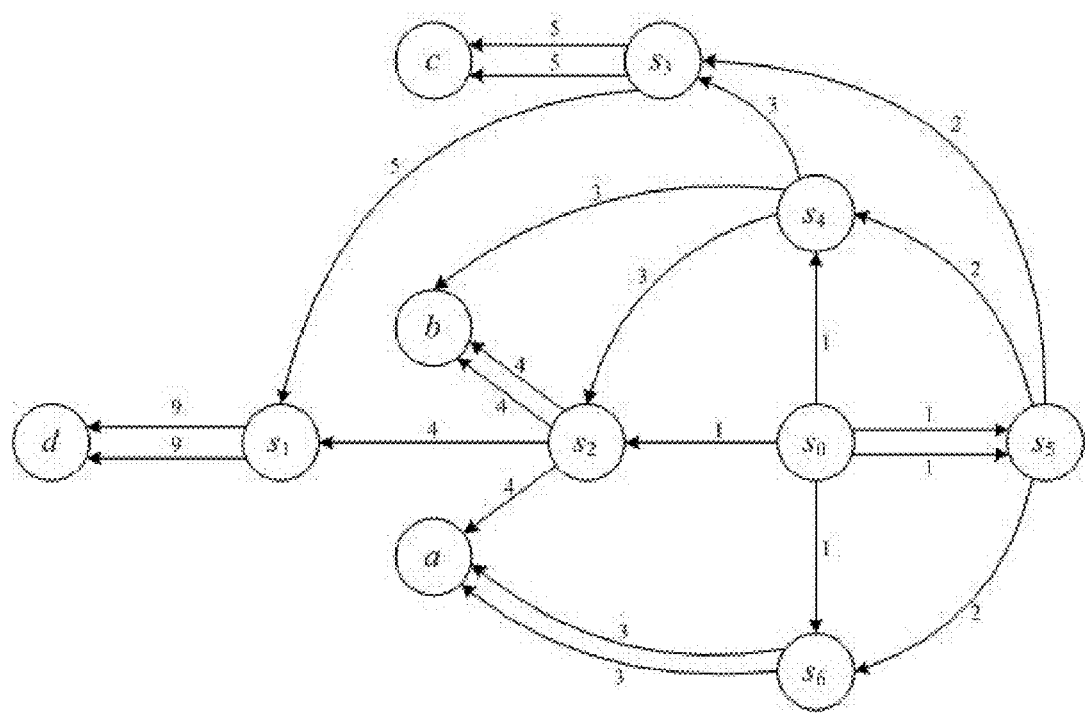
FIG. 7 is the graph representation of FIG. 6 with assigned weights.

As shown in FIG. 7, each edge is also assigned an associated weight dependent on its "expansion frequency". As used herein, the expansion frequency of an occurrence is the number of times the occurrence appears either explicitly or implicitly in the right member of the production rule of $s_0$, and can be used as a measure of significance or relevance. This is intuitively satisfying: those occurrences appearing more frequently are more relevant while those occurrences appearing less frequently are less relevant. The expansion frequency of an occurrence $(\alpha|\beta)_k$ is denoted $f^*\{(\alpha|\beta)_k\}$ and is defined recursively as $$f*\{(\alpha|\beta)_k\} \equiv \sum_\gamma \sum_l f*\{(\beta|\gamma)_l\},$$

where γ∈S(j), $f^*\{(\beta|\gamma)_l\} \equiv 0$ if $(\beta|\gamma)_l$ does not exist and $f^*\{(\beta|s_0)_l\} \equiv 1$ if $(\beta|s_0)_l$ exists. The expansion frequency of a grammar G is simply defined as the total expansion frequency of all its variables and terminal symbols.

$$f*\{G\} \equiv \sum_\alpha \sum_\beta \sum_k f*\{(\alpha|\beta)_k\}$$

For any α, β, γ, k, and l, whenever $(\gamma/\alpha)_l$ exists, the following property of expansion frequency is valid:

$$f*\{(\alpha|\beta)_k\} \leq f*\{(\gamma|\alpha)_l\}$$

with equality iff$(\alpha|\beta)_k$ exists, there is only one occurrence of α in the right members of G, and that occurrence is in β.

Each of the edges of the graph is labeled with the expansion frequency of the corresponding occurrence. This assigned label is called the "weight" of the edge. The expansion frequency of edges originating from the root node is given a value of '1'. The expansion frequencies of edges emanating from the other nodes, which are termed here unrooted, or non-root, nodes, are determined in accordance with the sum of expansion frequencies of edges input to, or directed to, each such unrooted node. In other words, from the definition of expansion frequency, the weight of an edge directed away from a node $s_i$ (i≠0) is equal to the sum of the weights of the edges directed towards that node.

In addition to determining the expansion frequency of each edge, constructing the graph of the admissible grammar can also comprise determining a shortest path from the root node to each non-terminal node, and assigning a shortest distance (SD) value to each non-terminal node in accordance with its respective shortest path. As used herein, a non-terminal node is a node, other than the root node, that does not represent a terminal symbol; in other words, an intermediate node, or a node that does not terminate the end of a path. In the illustrated embodiment of FIG. 8, the shortest distance, in number of edges, to each non-terminal node has been labeled. The shortest path can be calculated according to any shortest path algorithm, such as Dijkstra's algorithm.

Figure 9:
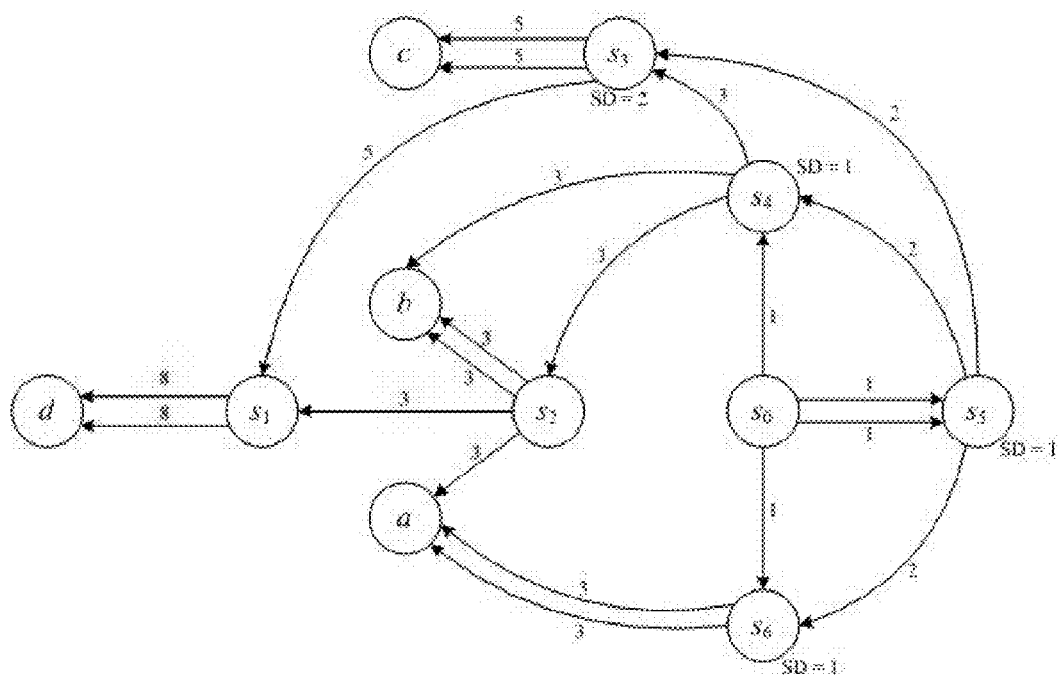
FIG. 9 shows the graph presentation of FIG. 8 with an edge pruned, and updated weights.
Figure 10:
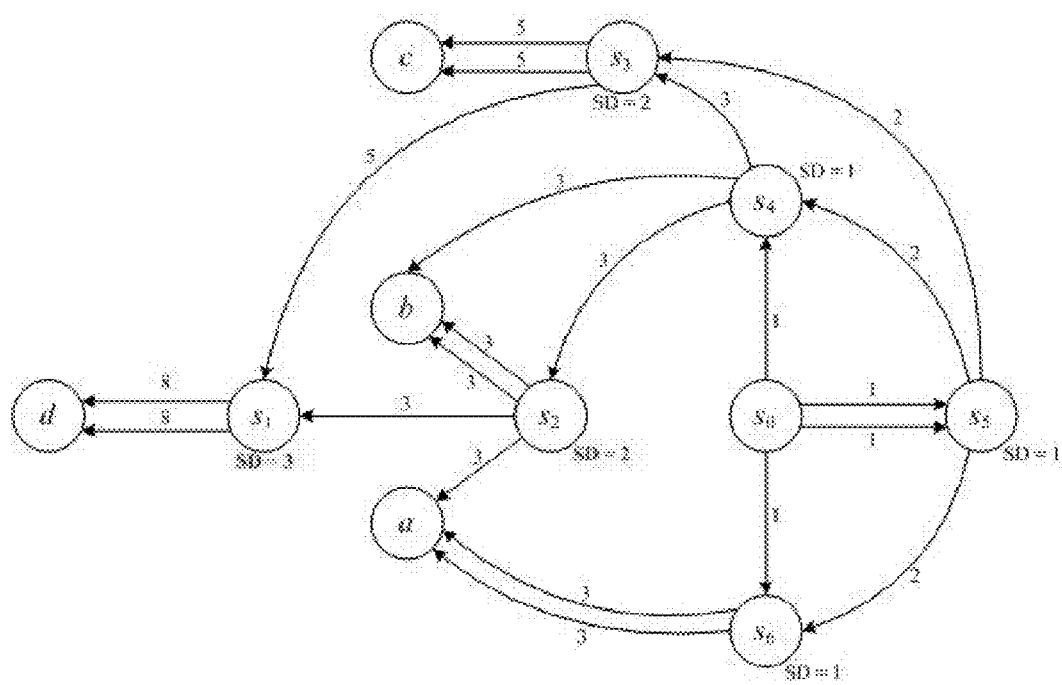
FIG. 10 shows the pruned representation of FIG. 9 with updated shortest distances.

Referring again to FIG. 5A, an edge having a lowest expansion frequency is then pruned from the graph representation (step 304). As used herein, "pruning" an edge means removing or deleting the edge from the graph representation. A pruned graph representation, where the edge representing the occurrence $(s_2|s_0)_0$ has been removed, is shown in FIG. 9. The pruning steps are set out in FIG. 5B, and are described in greater detail below. Any orphan edges and nodes are then pruned from the graph to generate a pruned graph representation (step 306). An orphan node is one that no longer has any incoming edges, and an orphan edge is an edge originating at an orphan node.

According to an embodiment, a pruned grammar $G_1$ is then derived by removing the pruned occurrences from the current production rules of the grammar G. If the length of the A-sequence of the starting variable |A($s_{0,1}$)| is determined to be less than or equal to a predetermined, or preset, length L (step 308), the A-sequence of the starting variable $A(s_{0,1})$ of the pruned grammar $G_1$ is output as side information, in accordance with production rules for pruned grammar $G_1$ (step 310). The output data sequence $A(s_{0,1})$ can then be used as side information for the encoder(s) 273, 277 and the decoder 103 shown in FIGS. 1 and 4.

The predetermined length L is set according to the practical constraints of the compression system, including, for example, the time available to initialize the compression system, the available bandwidth, available storage capacity, and other factors of design preference. The predetermined length L is a stopping condition for iterations of the method. The method can be performed iteratively until the length of the A-sequence of the starting variable $|A(s_{0,i})|$ of the pruned grammar is less than or equal to L, where i denotes the iteration number. Other stopping conditions, such as a predetermined maximum number of iterations can also be used as a stopping condition for the iterative method. For each iteration, the expansion frequencies are updated in accordance with the pruned graph representation (step 312). If shortest distances are being used to adjudicate ties (as described below in detail), the shortest distances are also updated prior to each iteration (step 314). It should be noted that after each iteration, an admissible grammar $G_i$, but not necessarily an irreducible grammar, is generated.

In summary, each iteration i (where i=1, 2, . . . ) consists of the following steps: (1) pruning the edge with the lowest expansion frequency (step 304); (2) pruning all edges and nodes that can no longer be reached from the root node $s_0$ (step 306), resulting in a new grammar $G_i$; (3) determining that $|A(s_{0,i})| \le L$, or other stopping condition is met, outputting $A(s_{0,i})$, and terminating; otherwise, (4) updating the expansion frequency (weight) of all affected occurrences (edges); (5) updating the shortest-distance between all affected nodes and the root node. While the steps of updating the expansion frequencies and shortest distance values are logically distinct, in practice they can be done together during sub-graph traversal.

With reference to FIG. 5B, the pruning step 304 will now be described in greater detail. In the graph representation, a search is made for edge(s) with the lowest expansion frequency $f*\{.\}$ (step 400). If a single edge is found to have the lowest expansion frequency (step 402), this edge is removed (step 404), and the method returns to step 306 in FIG. 5A. When two or more edges are identified as having the same lowest expansion frequency, tie-breaking rules can be applied to select the edge to prune. According to a presently preferred embodiment, one or more of the following tie-breaking rules can be applied to select the edge to prune:

Rule 1: Greatest shortest-distance from node $s_0$
Rule 2: Shortest A-sequence
Rule 3: Appears earliest in $A(s_{0,i-1})$ In other words, the tie-breaking rules can comprise (1) selecting the edge with the greatest shortest distance (SD) value; (2) selecting the edge terminating at a node with the shortest expanded sequence length, and (3) selecting the edge representing an instance of a variable having the least significant position in the input sequence $A(s_{0,i-1})$. In the illustrated embodiment, the rules are applied in descending order (steps 406, 410, 414), until an edge is removed at any one of steps 408, 412, 416.

According to a first variant, since Rule 3 implicitly assigns higher relevance to occurrences that appear later in the given information sequence $A(s_{0,i-1})$, if it is known that later strings in the given information sequence are more likely than earlier strings to occur in the data to be compressed, then Rule 2 can be omitted. According to a further variant, both Rule 1 and Rule 2 can be omitted, and only Rule 3 applied. Rule 3 is guaranteed to return one and only one occurrence for pruning. The omission of Rule 1 means that shortest-distances do not need to be determined at the outset or updated in step 314. This is the simplest and least computationally expensive variant of the present method.

According to another embodiment, the time and space complexity of the method can be reduced by pruning more than one edge in each iteration, and doing batch updates of expansion frequencies and shortest-distances. That is, instead of pruning one occurrence in each iteration, prune z>1 occurrences (z may be fixed or dynamic). This reduces the total number of iterations and update operations, but the final result is not guaranteed to be the same as the one obtained from the embodiment described above.

Figure 8:
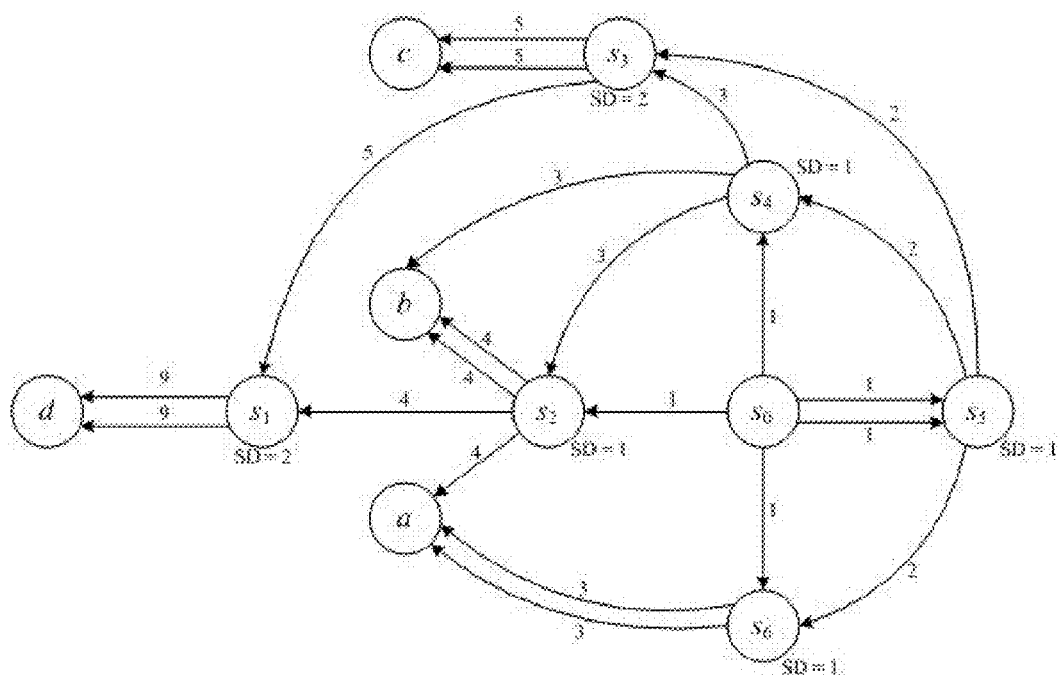
FIG. 8 is the graph representation of FIG. 7 labeled with shortest distances.

With reference to FIGS. 8-11, an example of two iterations of the present method will be described. It is assumed that later strings in the information sequence have a higher probability than earlier strings of occurring in the future, thus the first tie-breaking variant described above, in which Rule 2 is omitted, is used. In FIG. 8, the graph representation of grammar G is shown with weights and shortest-distance labels on each edge. As will be noted, each of the edges originating at root node $s_0$ has a weight of '1'. Therefore, the tie-breaking rules must be applied. Since each of the identified edges also has a shortest-distance value SD=1, applying Rule 3, the edge from node $s_0$ to node $s_2$, representing the occurrence $(s_2|s_0)_0$, is selected, and pruned from the graph representation, resulting in the pruned graph representation of FIG. 9. This pruning does not result in any orphan nodes or edges, so no additional pruning is required. In FIG. 9, the weights of the affected edges have been updated, and in FIG. 10, the shortest-distances have been updated.

Figure 11:
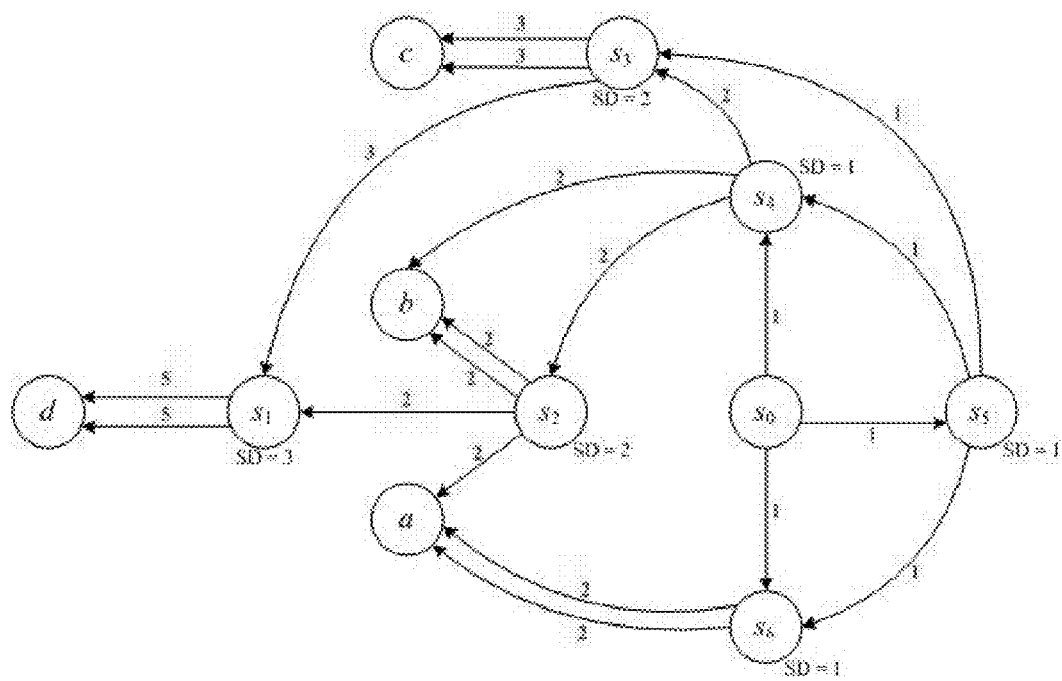
FIG. 11 shows the result of a further pruning of the graph representation of FIG. 10.

In a second iteration, again applying tie-breaking Rule 3, one of the edges from node $s_0$ to node $s_5$, representing the occurrence $(s_5|s_0)_0$, is removed from the graph representation, resulting in the pruned graph representation shown in FIG. 11. In FIG. 11, the weights of affected edges have again been updated (no change to the shortest-distance values resulted from this pruning).

As will be apparent to those of skill in the art, given an admissible grammar G of length $L<|A(s_0)|$, the present method attempts to maximize $f*\{G_i\}$ subject to the following constraints: (1) the resulting grammar $G_i$ is obtained by removing a finite, non-empty set of occurrences from G, and (2) $|A(s_{0,i})| \le L$. The method leverages the YK irreducible grammar transform. It attempts to maximize $f*\{G_i\}$ by iteratively pruning an occurrence with the lowest $f*\{.\}$. That is, in each iteration, the method finds and removes an occurrence with the lowest expansion frequency from the grammar (and graph representation). The method iterates until the length of the A-sequence of the starting variable is less than or equal to the prescribed maximum length L.

Comparative results showing the compression performance of a YK compression system using (1) no side information, (2) side information generated heuristically and (3) side information generated by the present method are shown in Table 1. The numbers in Table 1 are the sizes of the compressed data, relative to the original data (which has a relative size of 1.0). The sample data was a set of approximately 800 emails. Each email was compressed separately; Table 1 shows the aggregate results. The side information used to compress each email was generated using the previous emails in the sample data set.

TABLE 1

| | Compression of Email | | |
|---|---|---|---|
| Sample Data | No Side Information | Heuristic | YK Grammar Pruning |
| All emails | 0.331 | 0.215 | 0.171 |

As can be seen, augmenting a YK compression system using side information generated by the present method results in significantly improved performance. The improved compression ratio results in direct savings of bandwidth, and hence power, for transmission, and storage space.

While the present method has been described in terms of generating side information for data compression, as will be apparent to those of skill in the art, it can also be applied to other areas where graph representations of data can be generated, such as data mining.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A computer-implemented method for generating side information for grammar-based data compression systems, the method comprising:
   obtaining an admissible grammar (G) for an input sequence ($A(S_0)$) having a finite set of terminal symbols, the admissible grammar having a finite set of variables (S(j)), including a starting variable ($S_0$) representing the input sequence ($A(S_0)$), and a production rule for each variable in the finite set of variables (S(j)));
   constructing a graph representation of the admissible grammar (G), the graph representation including nodes for each variable in the finite set of variables and each terminal symbol in the finite set of terminal symbols, including a root node representing the starting variable ($S_0$) and directed edges linking the nodes, each directed edge being directed to a node and representing an instance of a variable or a terminal symbol corresponding to the node to which it is directed in the admissible grammar (G) as defined by the production rules, and each directed edge having an expansion frequency, wherein the expansion frequency of directed edges originating from the root node has a value of '1', and expansion frequencies of directed edges emanating from each non-root node are determined in accordance with summing of expansion frequencies of directed edges input to the non-root node;
   pruning, from the graph representation, a directed edge having a lowest expansion frequency to generate a pruned graph representation;
   deriving a pruned grammar (Gi);
   expanding a starting variable ($S_{0,i}$) of the pruned grammar (Gi) to generate the side information; and
   storing the side information in a computer memory device;
   wherein constructing the graph representation of the admissible grammar further comprises determining, for each non-terminal node, a shortest path from the root node to the non-terminal node, and assigning a shortest distance (SD) value to each non-terminal node in accordance with its respective shortest path;
   wherein, when two or more directed edges are identified as having the same lowest expansion frequency, pruning the directed edge having the lowest expansion frequency comprises applying tie-breaking rules to select the directed edge to prune;
   wherein the tie-breaking rules comprise at least one of selecting the one of the two or more directed edges with the greatest shortest distance (SD) value, selecting the one of the two or more directed edges leading to a node with the shortest expanded sequence length.

2. The method of claim 1 further comprising updating expansion frequencies of each directed edge in accordance with the pruned representation.

3. The method of claim 2 wherein the steps of pruning the directed edge and deriving the pruned grammar are repeated iteratively until a stopping condition is met.

4. The method of claim 3 wherein the stopping condition is the length of the expanded starting variable ($s_{0,i}$) of the pruned grammar ($G_i$) being less than or equal to a predetermined length.

5. The method of claim 1 wherein obtaining the admissible grammar (G) comprises obtaining an irreducible grammar.

6. The method of claim 5 wherein obtaining the irreducible grammar comprises applying a Yang-Kieffer (YK) grammar transformation to the input sequence ($A(s_0)$).

7. The method of claim 1 wherein, when two or more directed edges are identified as having the same lowest expansion frequency, pruning the directed edge representing an instance of a variable having the least significant position in the input sequence ($A(s_{0,i-1})$), wherein $s_{0,0}$ is $s_0$.

8. The method of claim 1 wherein pruning the directed edge further comprises pruning orphan nodes and orphan edges to generate the pruned graph representation.

9. The method of claim 1 further comprising updating the shortest distance (SD) values in accordance with the pruned graph representation.

10. The method of claim 1 wherein deriving the pruned grammar (G) comprises deriving new production rules by removing pruned occurrences from current production rules.

11. A non-transitory computer-readable medium embodying code which, when processed by one or more processors, causes the one or more processors to implement a method of generating side information for grammar-based data compression systems, the method comprising:
    obtaining an admissible grammar (G) for an input sequence ($A(S_0)$) having a finite set of terminal symbols, the admissible grammar having a finite set of variables (S(j)), including a starting variable ($S_0$) representing the input sequence ($A(S_0)$), and a production rule for each variable in the finite set of variables (S(j)));
    constructing a graph representation of the admissible grammar (G), the graph representation including nodes for each variable in the finite set of variables and each terminal symbol in the finite set of terminal symbols, including a root node representing the starting variable ($S_0$) and directed edges linking the nodes, each directed edge being directed to a node and representing an instance of a variable or a terminal symbol corresponding to the node to which it is directed in the admissible grammar (G) as defined by the production rules, and each directed edge having an expansion frequency, wherein the expansion frequency of directed edges originating from the root node has a value of '1', and expansion frequencies of directed edges emanating from each non-root node are determined in accordance with summing of expansion frequencies of directed edges input to the non-root node;

pruning, from the graph representation, a directed edge having a lowest expansion frequency to generate a pruned graph representation;

deriving a pruned grammar (Gi); and expanding a starting variable ($S_{0,i}$) of the pruned grammar (Gi) to generate the side information;

wherein constructing the graph representation of the admissible grammar further comprises determining, for each non-terminal node, a shortest path from the root node to the non-terminal node, and assigning a shortest distance (SD) value to each non-terminal node in accordance with its respective shortest path;

wherein, when two or more directed edges are identified as having the same lowest expansion frequency, pruning the directed edge having the lowest expansion frequency comprises applying tie-breaking rules to select the directed edge to prune;

wherein the tie-breaking rules comprise at least one of selecting the one of the two or more directed edges with the greatest shortest distance (SD) value, selecting the one of the two or more directed edges leading to a node with the shortest expanded sequence length.

12. The medium of claim 11 further comprising updating expansion frequencies of each directed edge in accordance with the pruned representation.

13. The medium of claim 12 wherein the steps of pruning the directed edge and deriving a pruned grammar are repeated iteratively until a stopping condition is met.

14. The medium of claim 13 wherein the stopping condition is the length of the expanded starting variable ($s_{0,i}$) of the pruned grammar ($G_i$) being less than or equal to a predetermined length.

15. The medium of claim 11 wherein obtaining the admissible grammar (G) comprises obtaining an irreducible grammar.

16. The medium of claim 15 wherein obtaining the irreducible grammar comprises applying a Yang-Kieffer (YK) grammar transformation to the input sequence.

17. The medium of claim 11 wherein, when two or more directed edges are identified as having the same lowest expansion frequency, pruning the directed edge representing an instance of a variable having the least significant position in the input sequence ($A(s_{0,i-1})$), wherein $s_{0,0}$ is $s_0$.

18. The medium of claim 14 wherein pruning the directed edge further comprises pruning orphan nodes and orphan edges to generate the pruned graph representation.

19. The medium of claim 11 further comprising updating the shortest distance (SD) values in accordance with the pruned graph representation.

20. The medium of claim 11 wherein deriving the pruned grammar (G) comprises deriving new production rules by removing pruned occurrences from current production rules.

* * * * *